United States Patent [19]

Matsubara

[11] Patent Number: 5,587,590
[45] Date of Patent: Dec. 24, 1996

[54] TEST PIECE FOR X-RAY INSPECTION

[75] Inventor: Yoshihisa Matsubara, Tokyo, Japan

[73] Assignee: NEC Corporation, Tokyo, Japan

[21] Appl. No.: 335,390

[22] Filed: Nov. 3, 1994

[30] Foreign Application Priority Data

Nov. 15, 1993 [JP] Japan ................................ 5-306998

[51] Int. Cl.[6] ................................................ H01L 23/58
[52] U.S. Cl. .......................... 257/48; 257/384; 257/757; 257/770
[58] Field of Search ............................ 257/48, 382, 383, 257/384, 377, 428, 435, 770; 378/71, 73, 81, 207

[56] References Cited

FOREIGN PATENT DOCUMENTS 62-67837   3/1987   Japan ........................................ 257/48

OTHER PUBLICATIONS

"Modeling of agglomeration in polycrystalline thin films: Application to $TiSi_2$ on a silicon substrate" by Nolen et al., J. Appl. Phys., vol. 71, No. 2, Jan. 15, 1992, pp. 720–724.
"Morphology and phase stability of $TiSi_2$ on Si" by Jeon et al., J. Appl. Phys. 71, (9), May 1, 1992, pp. 4269–4276.

*Primary Examiner*—Minhloan Tran
*Attorney, Agent, or Firm*—Sughrue, Mion, Zinn, Macpeak & Seas

[57] ABSTRACT

The invention provides a test piece of a thin film shaped material to be inspected for inspecting crystal structure thereof with an X-ray diffraction process. A width of the test piece is smaller than a diameter of a particle of phase transition material having phase-transited, and the test piece of a thin film-shaped material to be inspected is surrounded by an insulator, dielectric or oxide film. The test piece enables inspection of a crystal structure of thin film metal silicide by means of an X-ray diffraction process without lowering a diffraction intensity of the X-rays.

5 Claims, 5 Drawing Sheets

PARTICLE DIAMETER IS
LARGER THAN WIDTH ( d > W )

PARTICLE DIAMETER IS
LARGER THAN WIDTH
( d > W )

PARTICLE DIAMETER IS
SMALLER THAN WIDTH
( d < W )

TEST PIECE FOR X-RAY INSPECTION

BACKGROUND OF THE INVENTION

1. Field of the Invention

The invention relates to a test piece for use of X-ray inspection, and more particularly to a test piece to be used when silicide alloy formed in a semiconductor device is inspected with X-ray.

2. Description of the Prior Art

With the increasing integration these days due to down-sizing of a MOS transistor, a gate width is required to be smaller and smaller. Accordingly, when a microstructure having an order below a sub-micron is to be manufactured, a parasitic resistance such as a lead wire resistance and a contact resistance tends to increase. As one of solutions to this problem, "salicide", which is an abbreviation of self-aligned-silicide, draws attention. In salicide, an area in which silicon is in exposure, such as source/drain area and a gate electrode, is reacted with metal which is to be formed on the area, to thereby form a silicide film in self-alignment. The salicide technique is compatible with silicon process having been used so far, and further has many advantages such as decreasing a resistance of a conjunction which has been shallow and thereby caused a higher resistance with a semiconductor element being smaller and smaller, decreasing a contact resistance relative to aluminum, and highly densifying a pattern layout by applying to internal wiring layers. Thus, the salicide technique is indispensable for manufacturing a micro semiconductor device having a size of sub-micron order.

For instance, hereinbelow is explained a process for forming titanium silicide ($TiSi_2$) by means of a lamp anneal apparatus. First, there is formed openings in oxide film having been formed on a surface of silicon, to thereby expose a surface of silicon to atmosphere. Then, titanium is deposited in the openings. Then, titanium is reacted with silicon under a heat treatment at 700 degrees centigrade for about 30 minutes by means of a lamp anneal apparatus, to thereby form titanium silicide having C49 structure composed of metastable layers and also having a specific resistance in the range of 60 to 70 $\mu\Omega\cdot cm$. Then, excessive titanium and nitrided titanium are removed using a mixture solution of ammonium and hydrogen peroxide. Then, a resultant is thermally treated at 900 degrees centigrade for about 10 seconds to thereby form titanium silicide having a low resistance, more specifically, a resistance in the range of 15 to 18 $\mu\Omega\cdot cm$.

On the other hand, with a semiconductor device being down-sized, a diffusion layer is required to have a shallower depth for preventing latitudinal diffusion of impurities. However, if a conjunction interface of silicide is coincident with that of a diffusion layer, an electrical leak might occur at the conjunction interface. In order to prevent such a leak, a thickness of silicide film is required to be thinner.

However, to make a thickness of silicide film to be thinner entails an increase of a resistance of a silicide layer, and further poses two problems with respect to physical properties on the formation of silicide, for instance, physical properties of titanium silicide. One of the problems is a disconnection in a silicide layer due to cohesion, and the other is an increase of a temperature at which C49 structure is phase-transformed to C54 structure.

The reason of the disconnection in a titanium silicide film due to cohesion is considered as follows. The titanium silicide film begins to soften at 800 degrees centigrade, and then is fluidized. The fluidization occurs on a surface of a titanium silicide film or an interface of a titanium silicide film and a diffusion layer. Due to the fluidization of the titanium silicide film, titanium silicide is deformed so that a potential energy thereof is minimized. Thus, the titanium silicide is changed into island areas and thin film areas. Thus, the titanium silicide film loses non-uniformity about a thickness of a film, and further may introduce a complete disconnection therein, Accordingly, an electrical conductivity of the titanium silicide film is deteriorated, and a resistance of the film is increased. In addition, the decrease both in thickness of a silicide film and width of silicide wiring causes an increase of surface tension, and a temperature at which the cohesion begins in a thin film is lowered with a decrease of a thickness of the titanium silicide film. FIG. 1 shows a relationship between a resistance of a silicide layer and a lamp annealing temperature. By reducing a thickness of the silicide from 50 nanometers to 30 nanometers, a temperature at which cohesion begins can be lowered from approximately 900 degrees centigrade to approximately 870 degrees centigrade. Refer to the article authored by T. P. Nolan, R. Sinclair, and R. Beyers in J. Appl. Phys, 71(2), 15, 1992.

The formation of titanium silicide having low-resistivity needs a phase transition from the C49 structure which is a metastable phase and has a high layer resistance (a specific resistance is $2\times10^{-4}$ $\Omega\cdot cm$) to the C54 structure which is an equilibrium phase and has a low layer resistance (a specific resistance is $1.5\times10^{-5}$ $\Omega\cdot cm$). To manufacture a transistor in microstructure is required to increase a concentration of impurities and also decrease a thickness of a silicide film. A temperature at which a phase is transited varies in dependence on the concentration of impurities and the thickness of a silicide film. FIG. 2 shows a relationship between X-ray intensity of C49 titanium silicide (131) and a lamp annealing temperature. By reducing a thickness of a silicide film from 50 nanometers to 30 nanometers, the phase-transition temperature from C49 to C54 is raised from approximately 850 degrees centigrade to approximately 950 degrees or more. Refer to the article authored by H. Jeon, C. A. Sukow et al. in J. Appl. Phys, 71(9), 1, 1992.

Accordingly, titanium silicide can be formed in a temperature range limited by the phase transition temperature and a cohesion temperature. Thus, in a thin film silicide forming process, the phase transition temperature is an indispensable physical constant for controlling properties of a semiconductor device. There has been known various processes for determining a phase transition temperature of a high fusing point silicide, such as a use of a differential scanning calorimeter (DSC) and a direct observation with an electron microscope.

FIG. 3 is a schematic view of DSC. The DSC uses a thermo-balance placed in an inert gas atmosphere in a constant temperature bath 20. With an ambient temperature being raised at a constant rate by means of a heater 21 composed of Fe—Cr, a difference in temperature between balances on each of which is placed a reference sample 22 and a test sample 23, respectively, is successively measured with a thermo-couple 24. Then, a qualitative analysis is conducted based on the change in temperature of the test sample, and a quantitative analysis is conducted based on an area surrounded by a curve representing a relationship between a temperature difference and time. In this process in which DSC is used, the determination of a phase transition temperature is based on a quantity of heat of the test sample and the phase transition temperature. In other words, when a thin film formed on a silicon substrate merely by approximately 500 angstroms is to be tested for determining a phase transition temperature thereof, a quantity of heat of the thin film lowers sensitivity of measurement. In addition, thermal noise generated with a temperature raise also lowers sensitivity of measurement. For instance the sensitivity is 0.02, 0.2 and 5 mw at 500, 750 and 1000 degrees centigrade, respectively. Thus, the DSC method is not suitable for measuring a phase transition temperature of a high fusing point metal.

On the other hand, an X-ray diffraction process can easily determine a transition of crystal structure. FIG. 4 schematically illustrates a goniometer optical system for use with an apparatus for measuring diffracted X-ray using a X-ray diffraction process. A goniometer optical system for use with a diffracted X-ray measuring apparatus has a main purpose of enhancing diffraction angle resolution to thereby increase accuracy with which a spacing between crystal lattices is to be measured. In a goniometer optical system, an X-ray supplying source 31 transmits X-rays to a test sample 32 with an angle θ. Then, a diffracted X-ray present symmetrically about a normal line 37 of the test sample 32, namely a diffracted X-ray present at an angle 2θ with respect to the incident X-ray, is detected by a diffracted X-ray detector 33. The incident X-ray and diffracted X-ray are converged on a scanning circle 34 of the X-ray detector 33 (beam centralizing process). The goniometer optical system is designed based on a symmetrical reflection process as aforementioned, which is so-called a "θ-2θ process". The incident X-ray goes through a incident solar slit 35, and the diffracted X-ray exits through a receiver solar slit 36. The symmetrical reflection process as aforementioned provides high accuracy with which the diffracted X-ray measuring apparatus can measure a spacing between crystal lattices, and also provides crystal orientation.

A rate of an entire diffraction intensity $G_x$ in X-ray diffraction for a surface layer which is present at depth X is denoted by the following equation.

$$G_x = 1 - \exp[-\mu X(1/\sin\gamma + 1/\sin\beta)]$$

wherein μ represents an absorption efficiency, γ represents an angle of incidence, and β represents an angle of reflection.

Assuming that if the diffraction intensity by the above mentioned surface layer is 95% of the diffraction intensity of an entire test sample, the diffraction intensity is a sufficient value, the diffraction intensity by a portion present below the surface layer is disregarded, and then the depth X is an effective depth. Accordingly, a diffraction intensity is exponentially decreased in a thin sample having a thickness thinner than an effective penetration depth $X_1$ of X-ray. Accordingly, the larger an angle of incidence γ and an angle of reflection β are and also the smaller an absorption efficiency μ is, the larger the rate of an entire diffraction intensity is. It is preferable to use an incident X-ray having a large angle 2θ and also having a short wavelength.

However, when a chemical structure and a lattice constant of a thin surface layer such as a silicide layer, for instance, a titanium silicide layer is to be inspected, the angle θ has to be small in order to obtain an effective layer thickness through which X-ray can diffract. On the contrary, the angle θ has to be large in order to accurately measure a lattice constant. Thus, a conventional X-ray diffraction process poses a problem that a thin film cannot be measured with high accuracy.

SUMMARY OF THE INVENTION

It is an object of the present invention to provide a test sample for X-ray inspection in order to be able to inspect crystal structure of a thin film by means of a X-ray diffraction process with high accuracy.

The invention provides a test piece for inspecting the crystal structure of a material with an X-ray diffraction process, in which the material has a characteristic of phase-transition, in particular, diffusion-limited transformation, a width of the test piece is smaller than a diameter of a particle of the material having phase-transited, and the test piece is surrounded by an oxide film.

In a preferred embodiment, the test piece is metal silicide film having a high fusing point, and the oxide film comprises a silicon oxide film formed by oxidation of a silicon substrate.

In another preferred embodiment, the metal silicide film is titanium silicide film.

In still another preferred embodiment, the test piece is included in a semiconductor device.

In yet another preferred embodiment, a width of the metal silicide film is smaller than a diameter of metal silicide particle.

In still yet another preferred embodiment, a pattern for X-ray inspection is formed at least in an area other than an area where a semiconductor element is located. The pattern comprises metal silicide film having a high fusing point and silicon oxide film.

In a further preferred embodiment, the test piece is included in a semiconductor device which has striped patterns comprising diffusion layers having a thickness equal to or smaller than 1.0 μm, surrounded by element partition oxide films. The test piece is disposed so that a lengthwise direction of the pattern is perpendicular to a rotation axis of the test piece.

FIGS. 5A and 5B schematically illustrate a diameter of phase-transited material and a width of a test sample to be inspected. In FIG. 5A, "A" represents a core of phase-transition, and "B" represents a direction along which phase-transited crystals grow. As illustrated in FIG. 5A, by designing a diameter d of a particle of phase-transited material to be larger than a width of a test sample (d>w), the crystal growth during phase-transition is limited in only one direction, and hence a phase-transited crystal structure is like a bamboo structure.

On the other hand, if a diameter d of a particle of phase-transited material is designed to be smaller than a width of a test sample (d<w) as illustrated in FIG. 5B, the crystal growth during phase-transition is an anisotropic one, and thereby a phase-transited crystal structure becomes a polycrystal structure.

FIG. 6 shows a relationship between an X-ray intensity and a width of a test sample. It is understood from FIG. 6 that in diffusion-limited transformation, with a width being smaller, anisotropy due to crystal face orientation tends to be remarkable in a range wherein the width is equal to or smaller than approximately 1.0 μm. A diameter of a particle of titanium silicide ($TiSi_2$) in titanium silicide film is approximately 1.0 μm. Accordingly, by limiting a crystal growth direction during phase-transition when a width of a test sample is equal to or smaller than 1.0 μm, the crystal growth after phase-transition can have a large anisotropy.

An increase of the preferred orientation causes an increase of particles having the same crystal face orientation, and hence a diffracted X-ray intensity produced by identical particles can be increased. Accordingly, it is possible to measure a signal-noise ratio (SN ratio) with high accuracy without deterioration of measurement sensitivity even for a thin film. For instance, a phase-transition temperature can easily be determined for a thin film composed of titanium silicide, as illustrated in FIG. 7.

The advantages obtained by the aforementioned present invention will be described hereinbelow.

As having been explained, the invention provides a test piece for use of inspecting, with an X-ray diffraction process, crystal structure of a material having a characteristic of phase-transition. The test piece is designed to have a width smaller than a diameter of a particle of the material having phase-transited, and is surrounded by an oxide film. Thus, in diffusion-limited transformation, an isotropy due to crystal face orientation is remarkable with a width of a test piece being smaller. Namely, by limiting a crystal growth direction during phase-transition, the crystal structure after having been phase-transited can have a large anisotropy. An increase of the preferred orientation causes an increase of particles having the same crystal face orientation, and hence a diffracted X-ray intensity produced by identical particles can be increased. As a result, even when a thin film, in which a diffraction intensity is decreased due to a decreased number of diffraction lattices, is to be inspected, a phase-transition temperature can be determined without decreasing an diffraction intensity in any orientation.

In particular, by applying the invention to a semiconductor device in which a material to be tested is metal silicide film having a high fusing point, and the oxide film is silicon oxide film formed by oxidizing a silicon substrate or deposited on a silicon substrate, X-ray diffraction measurement can be conducted without decreasing a diffraction intensity for thin film metal silicide.

The above and other objects and advantageous features of the present invention will be made apparent from the following description made with reference to the accompanying drawings, in is which like reference characters designate the same or similar parts throughout the drawings.

DESCRIPTION OF THE PREFERRED EMBODIMENTS

A preferred embodiment in accordance with the present invention will be explained hereinbelow with reference to FIGS. 8A to 8D.

FIGS. 8A to 8D show an example in which a test piece in accordance with the invention is formed as a pattern for measuring, in a semiconductor having titanium silicide thin film having 300 angstroms of thickness. Namely, in the embodiment, a the oxide layer is a silicon oxide film formed by oxidizing a silicon substrate, and a test piece is a titanium silicide film surrounded by the silicon oxide film and comprises a semiconductor device.

Figure 1:
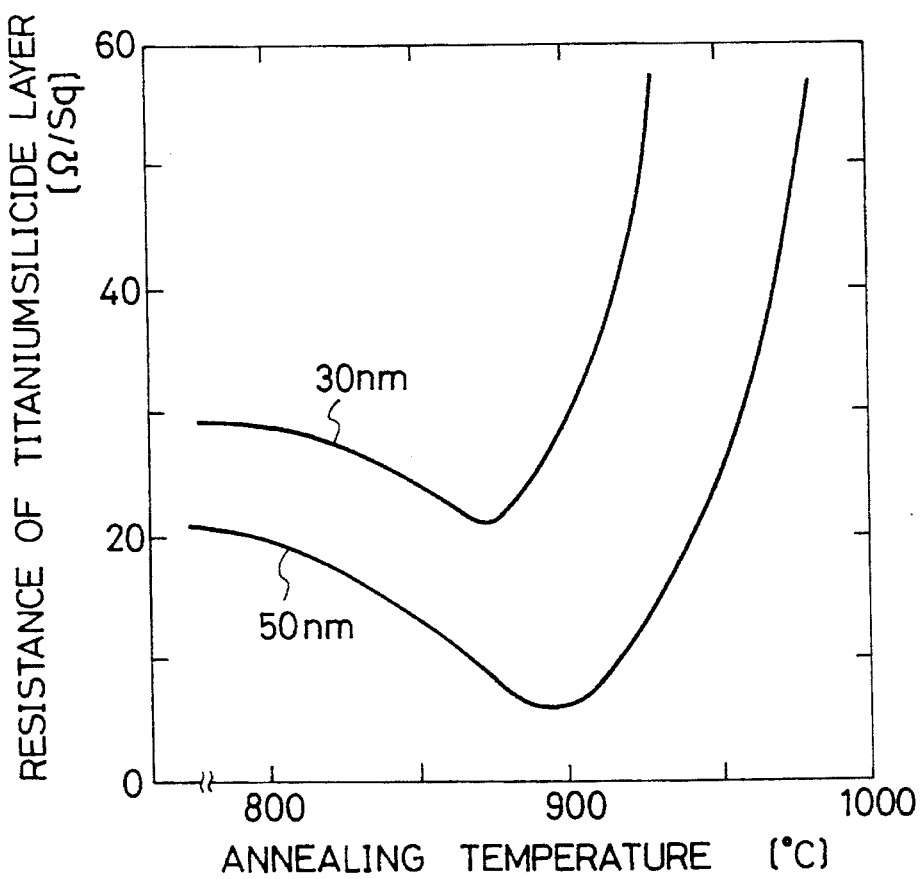
FIG. 1 is a graph showing a relationship between a resistance of titanium silicide and an annealing temperature.
Figure 2:
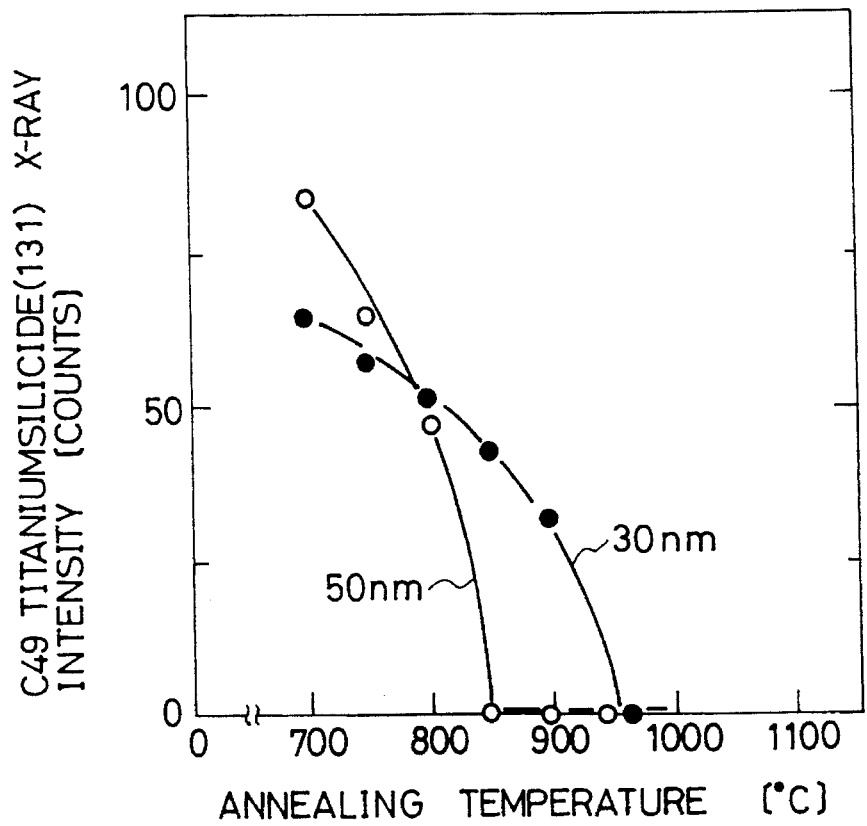
FIG. 2 is a graph showing a relationship between an X-ray intensity of titanium silicide (131) having C49 structure, and an annealing temperature.
Figure 3:
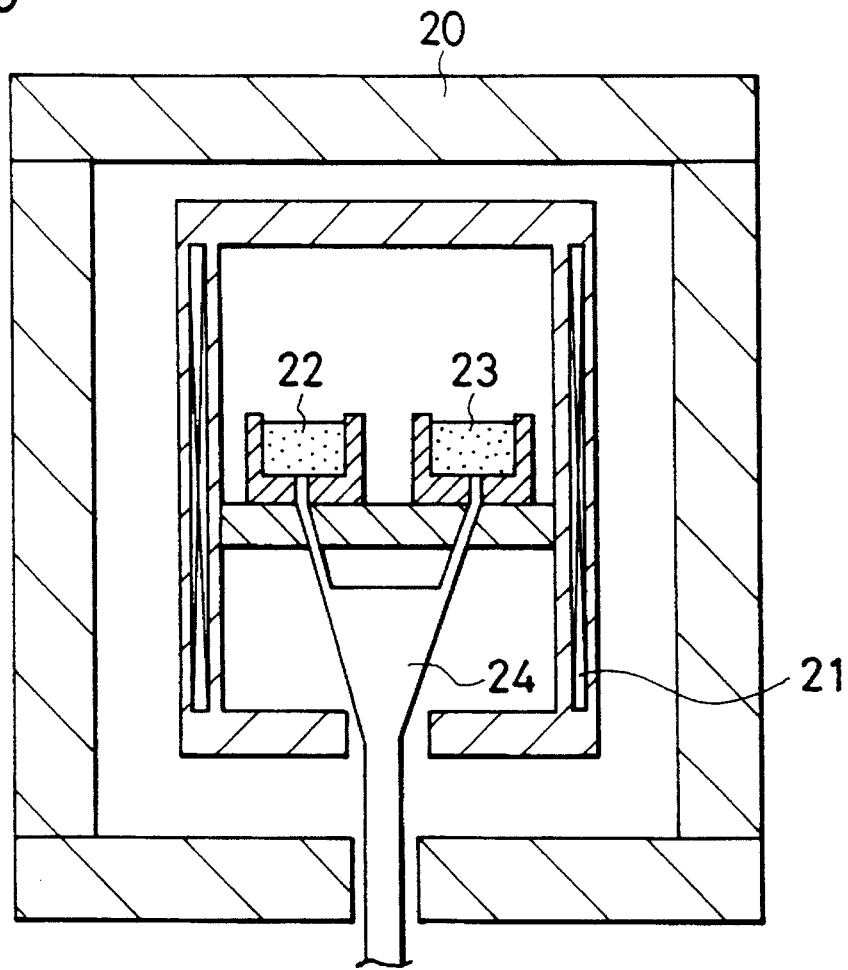
FIG. 3 is a schematic view illustrating a differential scanning calorimeter (DSC).
Figure 4:
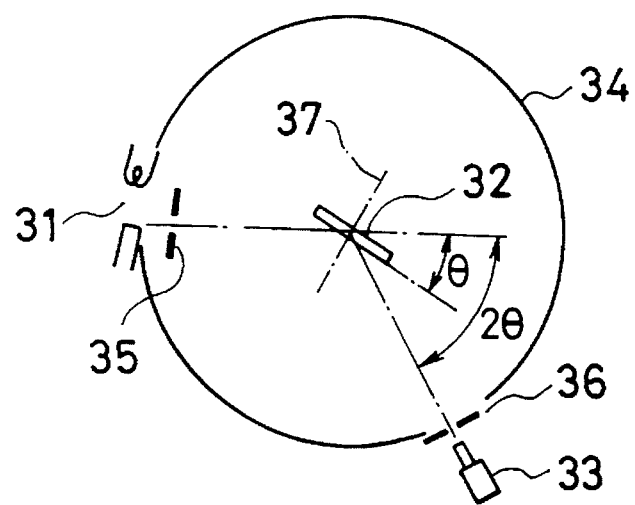
FIG. 4 is a schematic view illustrating a goniometer optical system used in a diffraction X-ray measuring apparatus.
Figure 5A:
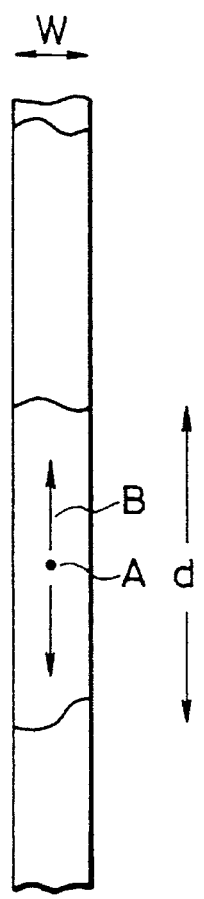
FIGS. 5A and 5B are schematic views for explaining a relationship between a diameter d of a particle and a width w of a test sample.
Figure 5B:
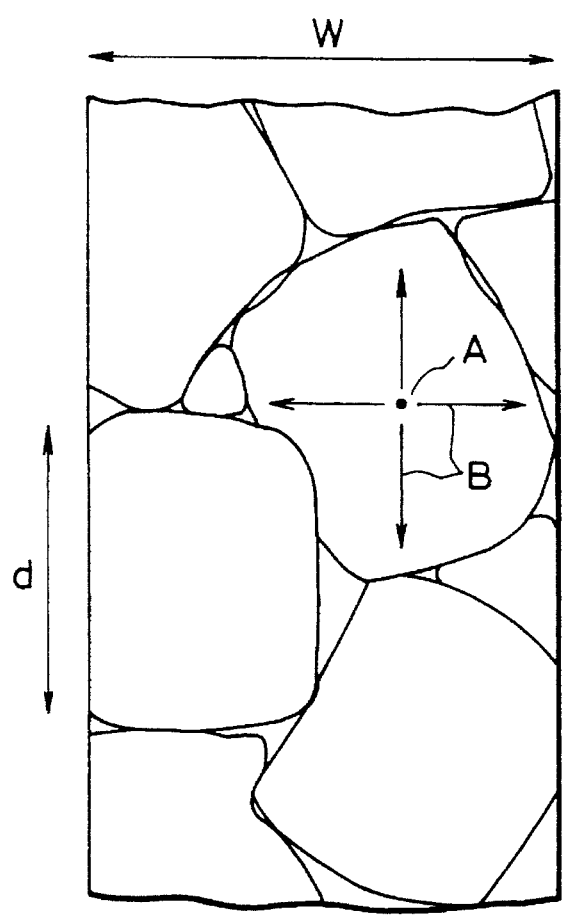
Figure 6:
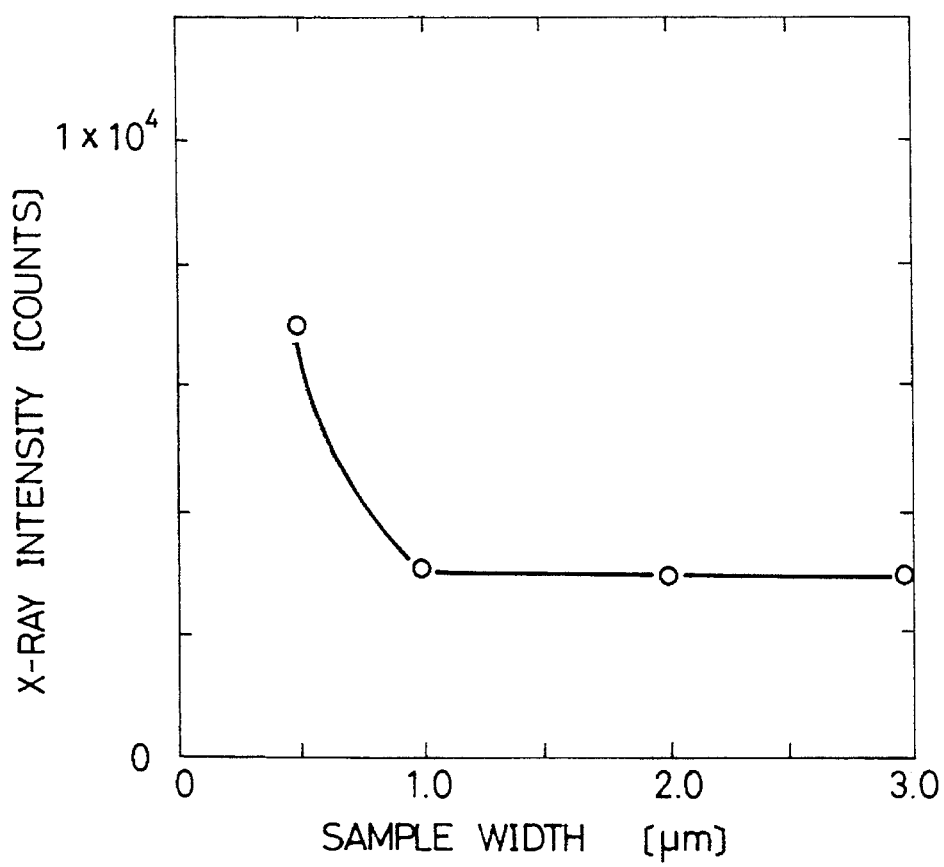
FIG. 6 is a graph showing a relationship between an X-ray intensity and a width of a test sample.
Figure 7:
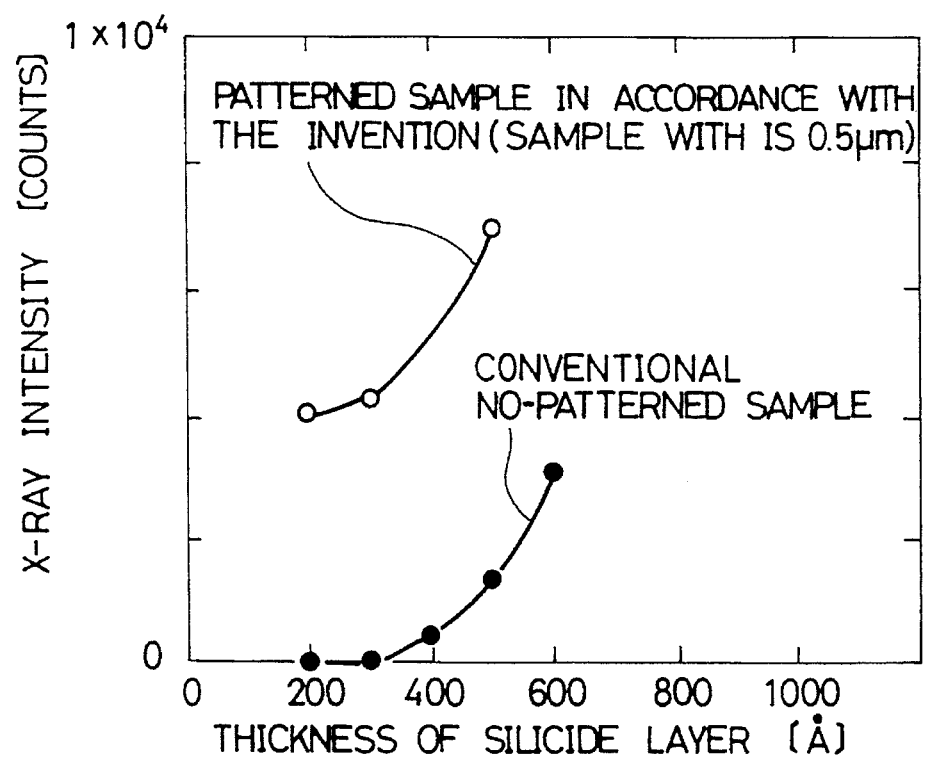
FIG. 7 is a graph showing a relationship between an X-ray intensity and a thickness of silicide film.
Figure 8A:
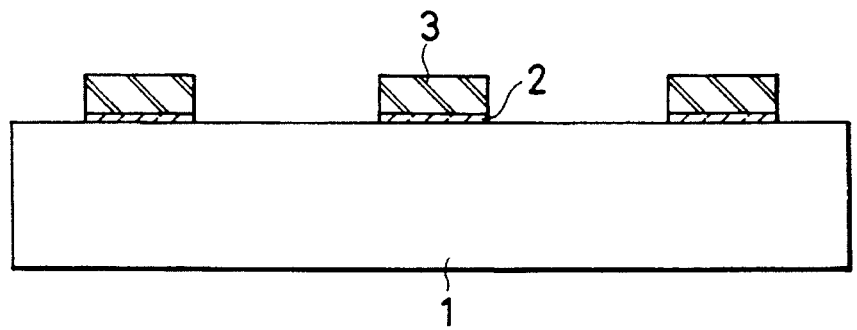
FIG. 8A, 8B, 8C and 8D show steps for manufacturing a test sample in accordance with an embodiment of the invention.

Hereinbelow will be explained steps for manufacturing the semiconductor device. First, as illustrated in FIG. 8A, on a silicon monocrystal substrate 1 on which a plane (100) is in exposure is formed a striped pattern in which diffusion layers having a width equal to or smaller than 1.0 µm are partitioned with partition oxide film, using a conventional process for a forming element partition oxide film. In this process, an oxide film 2 having 10 nm of thickness is first formed on the silicon substrate 1. Then, on the oxide film 2 is deposited a nitrided layer 3 having 120 nm of thickness. Then, the oxide film 2 together with the nitrided layer 3 are patterned so that they have width equal to or smaller than 1.0 µm, by means of photolithography process and a plasma etching apparatus.

Figure 8B:
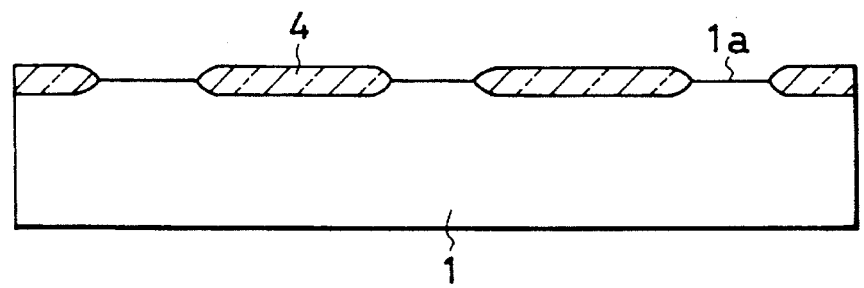

Then, as illustrated in FIG. 8B, by oxidizing a surface of the silicon substrate 1 with the nitrided layer 3 operating as a mask, oxide films 4 for partitioning elements are selectively formed and also exposure areas 1a having width equal to or smaller than 1.0 µm are formed.

Figure 8C:
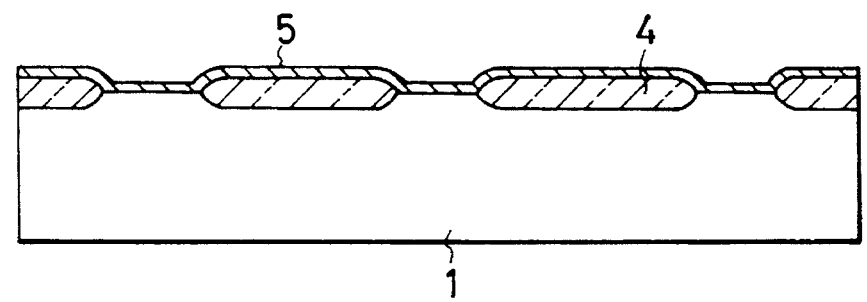

Then, as illustrated in FIG. 8C, over the oxide films 4 and exposure areas 1a are formed a titanium sputter layer 5. Then, a resultant is heat-treated by means of a rapid thermal anneal apparatus to thereby form titanium silicide layers 6 (see FIG. 8D) between the silicon substrate 1 and the titanium sputter layer 5.

Figure 8D:
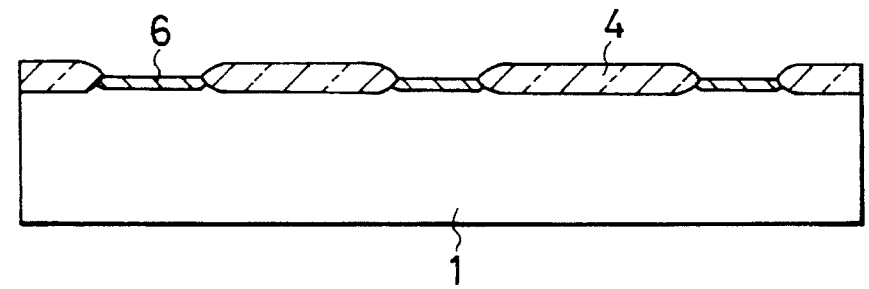

Finally, excessive titanium and nitrided titanium are removed by mixture solution of ammonium and hydrogen peroxide ($H_2O_2$). Thus, a test sample is completed as illustrated in FIG. 8D.

When a sample is to be formed in a striped pattern as described in the embodiment, if a lengthwise direction of the pattern is set to be parallel with a rotation axis of the sample, X-rays transmitted into the sample at a low angle are dispersed by element partition areas, and hence an X-ray diffraction intensity is lowered. Accordingly, the sample is fixed so that a lengthwise direction of the pattern is perpendicular to a rotation axis of a table on which the test sample is placed, in order not to allow an area of the test sample to vary due to rotation thereof.

When a sample surrounded by element partition areas formed in lattice-shape is to be inspected, incident X-rays and diffracted X-rays are always obstructed by element partition oxide films of any one direction. Accordingly, an X-ray intensity is varied with rotation of the sample, and hence this process is not suitable for measuring X-ray diffraction.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A sample of metal silicide film for facilitating inspection of a crystal structure of said film by an X-ray diffraction process, said sample comprising one or more stripes of metal silicide, each stripe of metal silicide having a width which is smaller than a diameter of a particle of the metal silicide, wherein said one or more stripes each has a width equal to or smaller than about 1.0 μm.

2. The sample in accordance with claim 1, wherein said metal silicide film is titanium silicide film.

3. The sample in accordance with claim 1, wherein said metal silicide film has a characteristic of phase-transition, and wherein said stripes are partitioned by a silicon oxide film oxidized on a surface of a silicon substrate.

4. The sample in accordance with claim 3, wherein said silicon oxide film has a thickness of about 10 nm.

5. A sample of metal silicide film for facilitating inspection of a crystal structure of said film by an X-ray diffraction process, said sample comprising one or more stripes of metal silicide, each stripe of metal silicide having a width which is smaller than a diameter of a particle of the metal silicide, wherein said sample is included in a semiconductor device, said semiconductor device having a striped pattern of diffusion layers, each of said diffusion layers having a width equal to or smaller than about 1.0 μm, said diffusion layers being partitioned by silicon oxide films, said one or more stripes of metal silicide being disposed on respective ones of said diffusion layers, and wherein a lengthwise direction of said diffusion layers is perpendicular to a rotation axis of said sample.

* * * * *